United States Patent
Bao et al.

(10) Patent No.: US 10,043,666 B2
(45) Date of Patent: Aug. 7, 2018

(54) METHOD FOR INTER-CHAMBER PROCESS

(71) Applicant: Applied Materials, Inc., Santa Clara, CA (US)

(72) Inventors: Xinyu Bao, Fremont, CA (US); Errol Antonio C. Sanchez, Tracy, CA (US); Zhiyuan Ye, San Jose, CA (US); Keun-Yong Ban, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/055,164

(22) Filed: Feb. 26, 2016

(65) Prior Publication Data
US 2017/0250078 A1    Aug. 31, 2017

(51) Int. Cl.
*H01L 21/02*    (2006.01)
*H01L 21/67*    (2006.01)
*C30B 25/02*    (2006.01)

(52) U.S. Cl.
CPC .. *H01L 21/02658* (2013.01); *H01L 21/02538* (2013.01); *H01L 21/67098* (2013.01); *H01L 21/67196* (2013.01); *H01L 21/67207* (2013.01)

(58) Field of Classification Search
CPC ................................................ H01L 21/02658
USPC ........................................................ 438/478
See application file for complete search history.

(56) References Cited

U.S. PATENT DOCUMENTS

| | | | |
|---|---|---|---|
| 2004/0175959 A1* | 9/2004 | Tamura | C30B 25/02 438/778 |
| 2005/0148162 A1 | 7/2005 | Chen et al. | |
| 2006/0138398 A1* | 6/2006 | Shimamune | H01L 21/02381 257/19 |
| 2006/0153995 A1 | 7/2006 | Narwankar et al. | |
| 2006/0175624 A1* | 8/2006 | Sharma | B82Y 20/00 257/94 |
| 2006/0286775 A1* | 12/2006 | Singh | C23C 16/0227 438/478 |
| 2007/0134827 A1 | 6/2007 | Bondokov et al. | |
| 2008/0032478 A1* | 2/2008 | Hudait | H01L 21/02381 438/285 |
| 2009/0151623 A1 | 6/2009 | Enicks | |
| 2012/0032234 A1* | 2/2012 | Wang | H01L 21/02381 257/200 |
| 2012/0295428 A1* | 11/2012 | Melnik | H01L 21/0242 438/504 |

(Continued)

FOREIGN PATENT DOCUMENTS

| | | |
|---|---|---|
| JP | H10321533 A | 12/1998 |
| JP | 2004319761 A | 11/2004 |
| KR | 20060018171 A | 2/2006 |

OTHER PUBLICATIONS

Wrriten Opinion and International Search Report from PCT/US2017/015852 dated May 12, 2017.

*Primary Examiner* — Moazzam Hossain
(74) *Attorney, Agent, or Firm* — Patterson + Sheridan LLP

(57) ABSTRACT

Embodiments described herein generally relate to a substrate processing system, such as an etch processing system. In one embodiment, a method of processing a substrate is disclosed herein. The method includes removing a native oxide from a surface of the substrate, baking the substrate in a pretreatment thermal chamber such that double atomic steps are formed on the surface of the substrate, and forming an epitaxial layer on the substrate after the substrate is baked.

12 Claims, 3 Drawing Sheets

(56) References Cited

U.S. PATENT DOCUMENTS

2014/0134848 A1  5/2014  Hisamatsu et al.
2014/0144375 A1  5/2014  Kim et al.
2014/0254620 A1* 9/2014  Bessette .............. H01L 21/0237
                                                    372/45.01
2016/0225608 A1* 8/2016  Kelman .............. C23C 16/0236

* cited by examiner

METHOD FOR INTER-CHAMBER PROCESS

BACKGROUND

Field

Embodiments described herein relate to an etch system for substrate processing, and more specifically to an integrated layer etch system with multiple type chambers.

Description of the Related Art

Film growth on silicon substrates may require double atomic step formation to reduce/eliminate anti-phase boundary defects. In the conventional process, after removing native oxides from the surface of the substrate, the substrate is then transferred to an epitaxial (Epi) chamber. In the Epi chamber, the substrate is baked at a very high temperature, e.g. at least 800° C., to form double atomic steps. The Epi chamber needs to be very clean during the bake process, otherwise residuals in the chamber will contaminate the silicon surface and prevent the formation of double atomic steps. To ensure that the Epi chamber is free from residuals, the Epi chamber undergoes a two-hour long conditioning process. The two-hour long conditioning process assures the high quality growth.

The two-hour long conditioning process hinders the number of semiconductor devices that may be produced. Currently, processes for forming double atomic steps on substrates produce about 0.4 substrates/hour. As the demand for semiconductor devices increases, the low throughput becomes a growing concern.

Thus, there is a continual need for improved methods for processing substrates and improving the throughput of substrate processing systems.

SUMMARY

Embodiments described herein generally relate to a substrate processing system, such as an etch processing system. In one embodiment, a method of processing a substrate is disclosed herein. The method includes removing a native oxide from a surface of the substrate, baking the substrate in a pre-treatment thermal chamber such that double atomic steps are formed on the surface of the substrate, and forming an epitaxial layer on the substrate after the substrate is baked.

In one embodiment, a substrate processing system is disclosed herein. The substrate processing system includes a transfer chamber, a pre-clean chamber coupled to the transfer chamber, a pre-treatment chamber coupled to the transfer chamber, and an epitaxy chamber coupled to the transfer chamber.

In another embodiment, a method for processing a substrate is disclosed herein. The method includes directionally modifying exposed layers of a film stack deposited on a surface of the substrate, selectively depositing etchants on a modified surface of the exposed layers, and exposing the substrate to a high-temperature sublimation process.

In another embodiment, a method of processing a substrate is disclosed herein. The method includes removing a native oxide from a surface of the substrate, baking the substrate at a temperature of at least 800° C. using a hydrogen gas such that double atomic steps are formed on the surface of the substrate, and forming an epitaxial layer on the substrate after the substrate is baked.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

For clarity, identical reference numerals have been used, where applicable, to designate identical elements that are common between figures. Additionally, elements of one embodiment may be advantageously adapted for utilization in other embodiments described herein.

DETAILED DESCRIPTION

Figure 1:
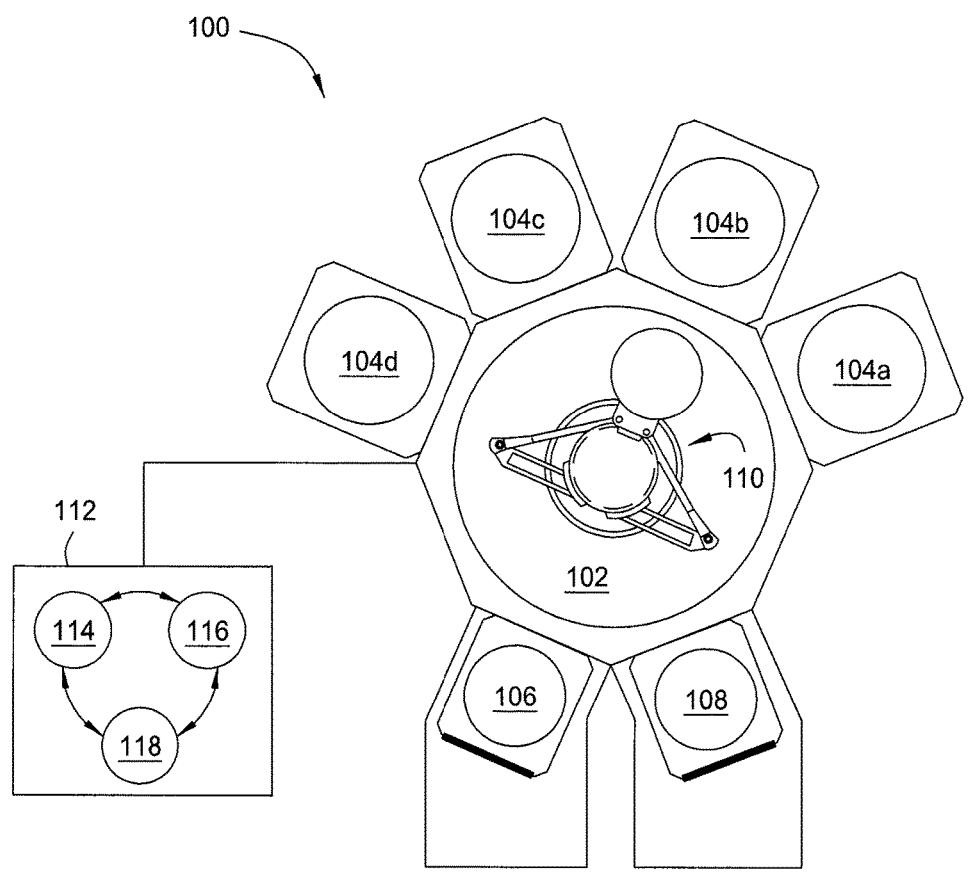
FIG. 1 illustrates a system for processing a substrate, according to one embodiment.

FIG. 1 illustrates a system 100 for processing a substrate, according to one embodiment. Exemplary cluster tools may include, but are not limited to, the CENTURA® platforms, available from Applied Materials, Inc., located in Santa Clara, Calif.

The processing system 100 includes a transfer chamber 102 and a plurality of chambers 104a-104d. Each processing chamber 104a-104d is coupled to the transfer chamber 102. The processing chambers 104a-104d may be outfitted to perform a number of substrate operations, such as etch, pre-clean, bake, thin film deposition, or other substrate processes. Processing chamber 104a is configured to remove a native oxide from a surface of the substrate. In one example, processing chamber 104a may be a pre-clean chamber, such as a Siconi chamber, available from Applied Materials, Inc., located, in Santa Clara, Calif. Processing chamber 104b is configured to bake the substrate in a pre-treatment thermal chamber such that double atomic steps are formed on the surface of the substrate. In one example, processing chamber 104b may be a pre-treatment thermal chamber, such as a rapid thermal processing (RTP) chamber. Exemplary RTP chambers include the VULCAN® chamber, available from Applied Materials, Inc., located in Santa Clara, Calif. Processing chamber 104c is configured to deposit a layer on the substrate after the substrate is baked. In one example, processing chamber 104c may be an epitaxial deposition (Epi) chamber.

Figure 2:
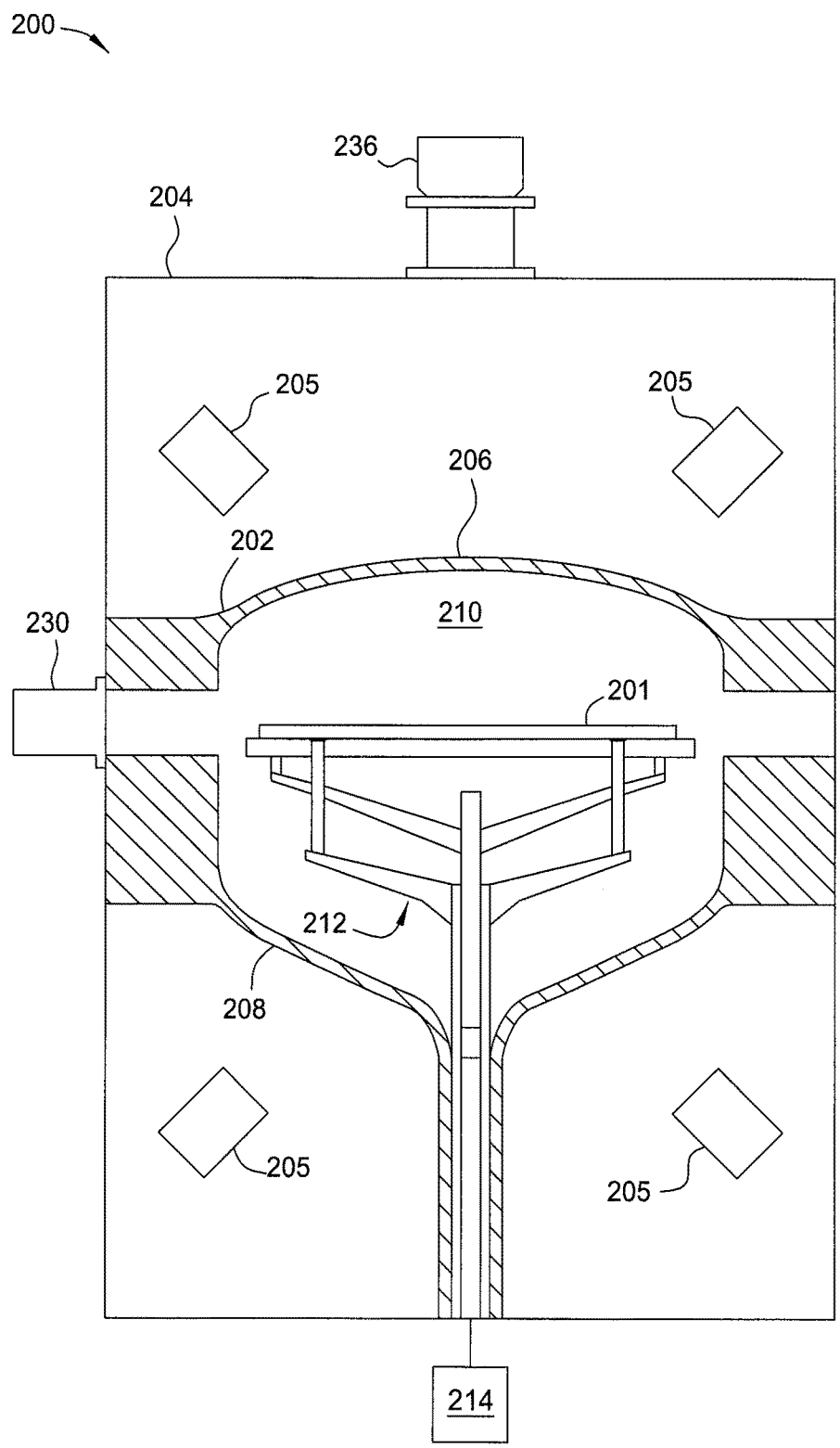
FIG. 2 illustrates an epitaxial chamber for use in the system of FIG. 1, according to one embodiment.

FIG. 2 illustrates an Epi chamber 200, according to one embodiment. The Epi chamber 200 includes a chamber body 202, a housing 204, and an energy source 205. The housing 204 envelopes and supports the chamber body 202. The chamber body 202 includes an upper dome 206 and a lower dome 208. The upper dome 206 and the lower dome 208 define the interior volume 210 of the processing chamber 200. A substrate support assembly 212 is positioned in the interior volume 210 of the chamber body 202. An actuator 214 may be coupled to the substrate support assembly 212. The actuator 214 may be configured to rotate the substrate support assembly 212.

In one embodiment, the energy source 205 may be embedded in the substrate support assembly 212. As illustrated in FIG. 2, the energy source 205 is disposed within the housing 204, outside the chamber body 202. The energy source 205 may be radiant, such as lamps, which may be resistive or emissive in nature. The lamps may be in separately powered groups distributed radially or azimuthally for a radially symmetric chamber. In another embodiment, the energy source 205 may be light emitting diodes (LEDs) or vertical-cavity surface emitting lasers (VCSEL). The energy source 205 is configured to provide heat to the chamber body 202. The upper dome 206 and the lower dome 208 are made from a transparent material, e.g. quartz or silicon carbide. The transparent material allows heat from the energy source 205 to freely enter the processing chamber 200 to heat a substrate 201. In some embodiments, a temperature sensor 236 may be positioned outside the upper dome 206 and oriented toward the substrate support assembly 212 to view thermal radiation emitted by a substrate during processing. The Epi chamber 200 may further include light barriers (not shown) to create a dark zone for radiant temperature sensors.

The Epi chamber 200 may further include a gas source 230 coupled to top or side of chamber 200 through showerhead, nozzle, portal, injector, and the like. The gas source 230 is configured to provide a processing gas to the Epi chamber 200.

Referring back to FIG. 1, the processing system 100 may further include load lock chambers 106, 108, a substrate handler 110, and a controller 112. The load lock chambers 106, 108 allow for the transfer of substrates (not shown) into and out of the processing system 100. Load lock chambers 106, 108 may pump down the substrates introduced into the processing system 100 to maintain a vacuum seal. The substrate handler 110 may transfer the substrates between load lock chambers 106, 108 and the processing chambers 104a-104d. The robot may also transfer the substrates between the load lock chambers 106, 108 and the transfer chamber 102.

The controller 112 may be configured to operate all aspects of the processing system 100, such as the method disclosed below in conjunction with FIG. 2. For example, the controller 112 may be configured to process a substrate by transferring the substrate among processing chambers 104a-104d in the processing system 100.

The controller 112 includes a programmable central processing unit (CPU) 114 that is operable with a memory 116 and a mass storage device, an input control unit, and a display unit (not shown), such as power supplies, clocks, cache, input/output (I/O) circuits, and the liner, coupled to the various components of the processing system to facilitate control of the substrate processing. The controller 112 also includes hardware for monitoring substrate processing through sensors in the processing system 100, including sensors monitoring the precursor, process gas, and purge gas flow. Other sensors that measure system parameters, such as substrate temperature, chamber atmosphere pressure, and the like, may also provide information to the controller 112.

To facilitate control of the processing system 100 described above, the CPU 114 may be one of any form of general purpose computer processor that can be used in an industrial setting, such as a programmable logic controller (PLC), for controlling various chambers and sub-processors. The memory 116 is coupled to the CPU 114 and the memory 116 is non-transitory and may be one or more of readily available memory such as random access memory (RAM), read only memory (ROM), floppy disk drive, hard disk, or any other form of digital storage, local or remote. Support circuits 118 are coupled to the CPU 114 for supporting the processor in a conventional manner. Charged species generation, heating, and other processes are generally stored in the memory 116, typically as software routine. The software routine may also be stored and/or executed by a second CPU (not shown) that is remotely located from the hardware being controlled by the CPU 114.

The memory 116 is in the form of computer-readable storage media that contains instructions, that when executed by the CPU 114, facilitates the operation of the processing system 100. The instructions in the memory 116 are in the form of a program product such as a program that implements the method of the present disclosure. The program code may conform to any one of a number of different programming languages. In one example, the disclosure may be implemented as a program product stored on a computer-readable storage media for use with a computer system. The program(s) of the program product define functions of the embodiments (including the methods described herein). Illustrative computer-readable storage media include, but are not limited to: (i) non-writable storage media (e.g., read-only memory devices within a computer such as CD-ROM disks readable by a CD-ROM drive, flash memory, ROM chips, or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are embodiments of the present disclosure.

Figure 3:
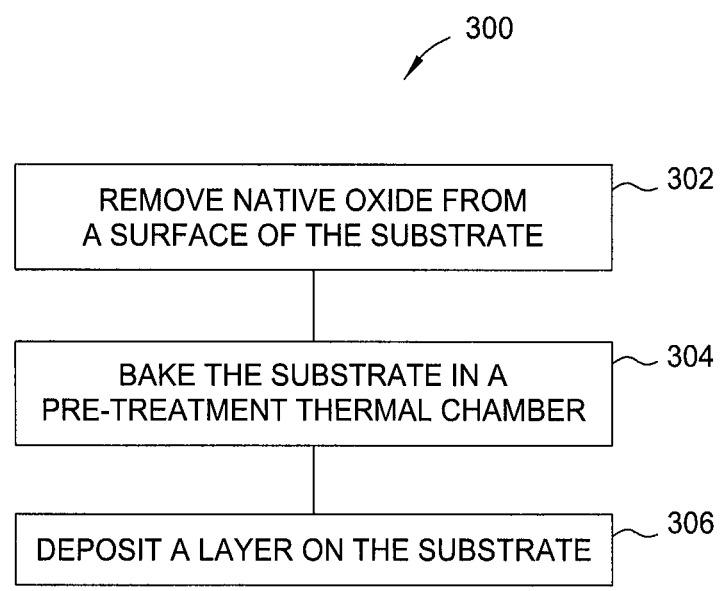
FIG. 3 illustrates a method for processing a substrate, according to one embodiment.

FIG. 3 illustrates a method 300 of processing a substrate, according to one embodiment. For example, the method 300 may be carried out with the processing system 100 described above in FIG. 1.

The method 300 begins at block 302. At block 302, a native oxide is removed from the surface of the substrate. The native oxide may be removed from the surface of the substrate processing chamber, such as processing chamber 104a. The native oxide may be formed when the substrate surface is exposed to oxygen and/or water. The native oxides may result from contamination during etching processes, prior to or after a deposition process. If the native oxide is not removed from the surface of the substrate, the native oxide may cause high contact resistance in source and drain areas and adversely increase the thickness of equivalent of oxide (EOT) in channel areas.

At block 304, the substrate is baked in a pre-treatment thermal chamber such that double atomic steps are formed on the surface of the substrate. The substrate may also be baked in the pre-treatment thermal chamber such that single atomic steps are formed as well. For example, the substrate may be baked in chamber 104b in processing system 100. The substrate may be baked in chamber 104b at a temperature of at least 800° C., for example 825° C., for about 5 minutes in $H_2$ gas.

Double atomic steps are formed on the surface of the substrate when the substrate is baked in the pre-treatment thermal chamber. An atomic step is a step-like structure, or terrace, that may be formed from a crystal structure of the substrate. For a single atomic Si step, if, for example, the user wants to deposit GaAs (or other III-V materials such as GaN, AlN, AlAs, GaP, InP, InAs, InGaAs, GaSb, GaAsSb, InSb etc.) to the surface of the Si substrate, one atomic layer of Ga will be deposited on the substrate and one atomic layer of As will be deposited on the substrate, on top of the Ga layer. In this single atomic step construction, the GaAs layer deposited on the adjacent Si steps will have opposite phases, which are called antiphase domains. Antiphase boundary defects are formed between the domains. By forming double atomic steps, the antiphase domains can be eliminated. The crystal quality can be greatly improved without antiphase defects.

At block 306, an epitaxial layer is formed on the substrate after the substrate is baked. The substrate may undergo deposition in chamber 104c. For example, the epitaxial layer may be formed from GaAs. The epitaxial layer may adhere better to the surface of the substrate due to the double atomic steps formed in block 304.

Method 300 increases the substrate throughput from about 0.4 substrates/hour to about 2.0 substrates/hour by separating the bake operation at block 304 from the deposition operation at block 306. There is no longer a need to bake the substrate in the epitaxial chamber before deposition. Therefore, the 2-hour conditioning process is now reduced to a five minute baking process.

While the foregoing is directed to specific embodiments, other and further embodiments may be devised without departing from the basic scope thereof, and the scope thereof is determined by the claims that follow.

What is claimed is:

1. A method of processing a substrate, comprising:
    removing a native oxide from a surface of the substrate, wherein the substrate contains silicon;
    baking the substrate in a pre-treatment thermal chamber at a temperature between about 800° C. and about 1000° C. using a gas consisting essentially of hydrogen such that double atomic steps are formed on the surface of the substrate; and
    depositing a layer on the substrate in a second chamber after the substrate is baked.

2. The method of claim 1, wherein the substrate is baked using $H_2$ gas.

3. The method of claim 1, wherein the substrate is baked for about one to ten minutes.

4. The method of claim 1, wherein the layer deposited on the substrate is an epitaxial layer.

5. The method of claim 4, wherein the epitaxial layer is deposited using a material selected a group III-group V compounds.

6. The method of claim 1, further comprising:
    baking the substrate in the pre-treatment thermal chamber such that single atomic steps are formed.

7. A method of processing a substrate, comprising:
    removing a native oxide from a surface of the substrate, wherein the substrate contains silicon;
    baking the substrate in a pre-treatment thermal chamber at a temperature between about 800° C. and about 1000° C. using a gas consisting essentially of hydrogen such that double atomic steps are formed on the surface of the substrate; and
    forming an epitaxial layer on the substrate in a second chamber after the substrate is baked.

8. The method of claim 7, wherein the substrate is baked at a temperature of about 825° C.

9. The method of claim 7, wherein the substrate is baked using $H_2$ gas.

10. The method of claim 7, wherein the substrate is baked for about one to ten minutes.

11. The method of claim 7, wherein the epitaxial layer is formed using a material selected a group III-group V compounds.

12. The method of claim 7, further comprising:
    baking the substrate in the pre-treatment thermal chamber such that single atomic steps are formed.

* * * * *